(12) United States Patent
Couillard et al.

(10) Patent No.: US 7,282,738 B2
(45) Date of Patent: Oct. 16, 2007

(54) FABRICATION OF CRYSTALLINE MATERIALS OVER SUBSTRATES

(75) Inventors: James G. Couillard, Ithaca, NY (US); Kishor P. Gadkaree, Big Flats, NY (US); Youchun Shi, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/851,038

(22) Filed: May 21, 2004

(65) Prior Publication Data

US 2005/0012099 A1 Jan. 20, 2005

Related U.S. Application Data

(63) Continuation-in-part of application No. 10/622,606, filed on Jul. 18, 2003, now Pat. No. 7,071,022.

(51) Int. Cl.
H01L 29/04 (2006.01)
H01L 27/01 (2006.01)
B05D 3/02 (2006.01)
C01B 33/04 (2006.01)

(52) U.S. Cl. .................. 257/64; 427/226; 427/387; 427/407.2; 427/409; 257/72; 257/627; 257/347; 423/342; 423/347

(58) Field of Classification Search ............ 257/64, 257/72, 627, 347; 427/226, 387, 407.2, 409; 423/342, 347
See application file for complete search history.

(56) References Cited

U.S. PATENT DOCUMENTS

| 5,147,826 A | 9/1992 | Liu et al. ............... 437/233 |
| 5,352,485 A | 10/1994 | DeGuire et al. ........... 427/226 |
| 5,523,587 A | 6/1996 | Kwo ...................... 257/64 |
| 5,751,018 A | 5/1998 | Alivisatos et al. ........... 257/64 |
| 5,879,970 A * | 3/1999 | Shiota et al. .............. 438/151 |
| 5,940,693 A | 8/1999 | Maekawa ................. 438/166 |
| 6,225,197 B1 | 5/2001 | Maekawa ................. 438/487 |
| 6,241,817 B1 | 6/2001 | Jang et al. ................ 117/8 |
| 6,432,757 B1 | 8/2002 | Noguchi et al. ........... 438/166 |
| 6,448,118 B2 | 9/2002 | Yamazaki et al. .......... 438/166 |
| 6,464,780 B1 | 10/2002 | Mantl et al. .............. 117/90 |
| 6,586,116 B1 * | 7/2003 | Bian et al. ............... 428/651 |

(Continued)

FOREIGN PATENT DOCUMENTS

EP 0 598 361 5/1994

(Continued)

OTHER PUBLICATIONS

Mayer, James and Lau, S.S., Electronic Materials Science: For Integrated Circuits in Si and GaAs, 1990, Macmillian Publishing, 1st edition, p. 66.*

(Continued)

*Primary Examiner*—Robert Kunemund
*Assistant Examiner*—G. Nagesh Rao
(74) *Attorney, Agent, or Firm*—Christopher Nicastri; William J. Tucker (57) ABSTRACT

A method of forming crystalline or polycrystalline layers includes providing a substrate and a patterning over the substrate. The method also includes providing nucleation material and forming the crystalline layer over the nucleation material. The crystalline material disposed over the substrate may be monocrystalline or polycrystalline.

16 Claims, 6 Drawing Sheets

U.S. PATENT DOCUMENTS

| | | | |
|---|---|---|---|
| 6,900,115 B2* | 5/2005 | Todd | 438/478 |
| 7,071,022 B2* | 7/2006 | Couillard et al. | 438/97 |
| 2001/0012567 A1 | 8/2001 | Saitoh et al. | 428/472 |
| 2002/0168868 A1* | 11/2002 | Todd | 438/767 |
| 2005/0012099 A1 | 1/2005 | Couillard et al. | 257/66 |

FOREIGN PATENT DOCUMENTS

| | | |
|---|---|---|
| EP | 0 651 431 | 5/1995 |
| EP | 1 119 053 | 7/2001 |
| WO | WO 03/057949 | 7/2003 |

OTHER PUBLICATIONS

Niesen, et al.; "Chemical liquid deposition of gallium nitride thin films on siloxane-anchored self-assembled monolayers"; Materials Chemistry and Physics 73 (2002) pp. 301-305.

E. Burch et al., "Template-assisted electrochemical deposition of ultrathin films of cadmium sulphide", Thin Solid Films, vol. 305, 1997, pp. 95-102.

D. Ji et al., "Improved protein crystallization by vapor diffusion from drops in contact with transparent, self-assembled monolayers on gold-coated glass coverslips", Journal of Crystal Growth, vol. 218, 2000, pp. 390-398.

J. Aizenberg et al., "Control of crystal nucleation by patterned self-assembled monolayers", Nature, vol. 398, Apr. 1999, pp. 495-498.

R. Staub et al., "Scanning tunnelling microscope investigations of organic heterostructures prepared by a combination of self-assembly and molecular beam epitaxy", Surface Science, vol. 445, 2000, pp. 368-379.

J. Flath et al., "Nucleation and growth of semiconductor particles on self-assembled monolayers by chemical solution deposition", Thin Film Solids, vols. 327-329, 1998, pp. 506-509.

H. Lin et al., "Preparation of TiO2 films on self-assembled monolayers by sol-gel method", Thin Solid Films, vol. 315, 1998, pp. 111-117.

D.G. Ast et al., "Kinetics of silicide-induced crystallization of polycrystalline thin-film transistors fabricated from amorphous chemical-vapor deposition silicon", Applied Physics Letters, vol. 72, No. 7, Feb. 16, 1998, pp. 803-805.

Agarwal et al., "Synthesis of ZrO2 and Y2O3-Doped ZrO2 thin films using self-assembled monolayers", Journal of the American Ceramic Society, vol. 80, No. 12, 1997, pp. 2967-2981.

N.D. Zakharov et al., "Structure and optical properties of Ge/Si superlattice grown at Si substrate by MBE at different temperatures", Materials Science and Engineering B87, 2001, pp. 92-95.

"Curvature changing or flattening of anodically bonded silicon and borosilicate glass", Harz, et al Sensors and Actuators A 55 (1996) 201-209.

* cited by examiner

FABRICATION OF CRYSTALLINE MATERIALS OVER SUBSTRATES

CROSS-REFERENCE TO RELATED APPLICATIONS

The present application is a continuation-in-part application of U.S. patent application Ser. No. 10/622,606 (now U.S. Pat. No. 7,071,022), to Couillard, et al. entitled "Silicon Crystallization Using Self-Assembled Monolayers" filed on Jul. 18, 2003 and assigned to the present assignee. Priority under 35 U.S.C. §120 is claimed, and the entire disclosure of this application is specifically incorporated herein by reference.

BACKGROUND

In many technologies, it is useful to incorporate electronic components over a substrate of the device. Often, these electronic devices are formed from one or more semiconductor layers formed over the substrate. For example, thin film transistors (TFTs) are often formed from semiconductor materials disposed over a substrate in liquid crystal (LC) panels and in organic light-emitting diode (OLED) panels. LC panels and OLED panels are used in LC displays (LCDs) and OLED displays respectively. Additionally, solar panels often comprise a plurality of individual cells that incorporate transistors formed from one or more semiconductor layers formed over a substrate.

In LCD devices, a layer of liquid crystal material is modulated by voltages, which are controlled using electronic components including TFT arrays. Typically, the transistors of the arrays are metal oxide semiconductor (MOS) devices. In solar panels, MOS devices are used for charge storage.

The LCD displays often comprise a glass substrate with the transistors disposed over the glass substrate and beneath a layer of LC material. The transistors are arranged in a patterned array, and are driven by peripheral circuitry to provide desired switching voltages to orient the molecules of the LC material in the desired manner. Moreover, the transistors of the array are often formed directly on or over the glass substrate from a semiconductor material such as silicon or silicon-germanium (SiGe).

In solar panels, charge storage cells may be formed from a matrix of MOS based devices fabricated from either silicon or SiGe formed on a glass substrate. This matrix may be used for selective charge storage of photocurrent generated through photon absorption.

Because the mobility of carriers is generally greater in monocrystalline and polycrystalline semiconductor materials compared to carriers in a semiconductor material in the amorphous phase, it is beneficial to grow crystalline structures on or over the glass substrate of the LCD display or the solar panel. The semiconductor devices may then be fabricated from the monocrystalline or polycrystalline material, resulting in relatively high mobility transistors and other components where high mobility is desired.

While various techniques have been attempted to form crystalline silicon on glass substrates, there are deficiencies. For example, desired substrate materials are damaged using known fabrication methods. Additionally, the resultant material's characteristics are not acceptable. As such, what is needed is a method of fabricating crystalline materials over substrates that overcomes at least the deficiencies of the known techniques.

SUMMARY

In accordance with an example embodiment, a method of forming crystalline or polycrystalline layers includes providing a substrate and providing nucleation material over the substrate. The method also includes providing an amorphous layer over the substrate and crystallizing the amorphous layer.

In accordance with an example embodiment, a layered structure includes a substrate, a crystalline layer disposed over the substrate and a plurality of nucleation sites disposed over the substrate.

BRIEF DESCRIPTION OF THE DRAWINGS

The invention is best understood from the following detailed description when read with the accompanying drawing figures. It is emphasized that the various features are not necessarily drawn to scale. In fact, the dimensions of the various features may be arbitrarily increased or decreased for clarity of discussion.

DETAILED DESCRIPTION

In the following detailed description, for purposes of explanation and not limitation, specific details are disclosed in order to provide a thorough understanding of example embodiments. However, it will be apparent to one of ordinary skill in the art that the present invention may be practiced in other embodiments that depart from these specific details provided. It is noted that detailed descriptions of well-known devices and methods are often omitted so as to not obscure the description of the present invention. Finally, wherever practical, like reference numerals refer to like features.

Briefly, example embodiments are drawn to the fabrication of monocrystalline or polycrystalline semiconductor layers having relatively large grain sizes, and a substantially uniform grain size across the layer. It is noted that although the present disclosure describes these illustrative methods in connection with forming monocrystalline or polycrystalline silicon (Si) over a glass substrate, these are merely illustrative applications. To wit, as will become clearer as the present description continues, the exemplary methods are useful in fabricating other layers of crystalline (monocrystalline or polycrystalline) materials over a substrate. For example, the substrate may be an oxide of germanium (Ge) and the crystalline layer may be germanium. Alternatively, the glass substrate may be an oxide of silicon or germanium, with a SiGe crystalline structure formed thereover. Finally, it is noted that a plurality of layers of crystalline (monocrystalline or polycrystalline) material may be formed over the substrate in keeping with the example embodiments. This would require the repetition of the chosen fabrication sequence(s) of the example embodiments.

It is also noted that the apparati formed by the illustrative methods may be used in LCD displays, head-up displays, or similar devices. Moreover, the apparati may be used in an organic light emitting diode (OLED) displays; silicon-on-insulator (SOI) electronic integrated circuits; or in solar panel applications. It is emphasized that the referenced applications are merely illustrative. In general, the methods and apparati of the example embodiments may be implemented in devices benefiting from relatively high mobility semiconductor thin films formed over substrates, where the substrates are susceptible to damage using known crystalline fabrication techniques, which may require elevated temperatures.

Figure 1A:
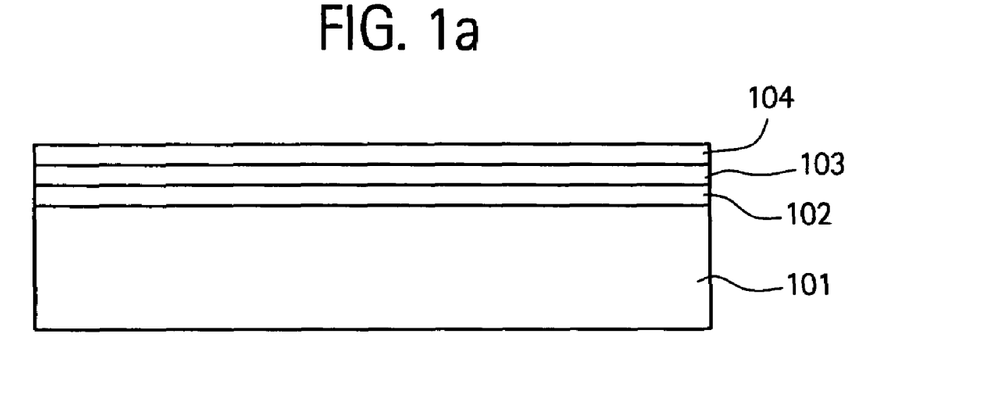
FIGS. 1a-1c are cross-sectional views of an illustrative fabrication sequence for forming crystalline material in accordance with an exemplary embodiment.
Figure 1B:
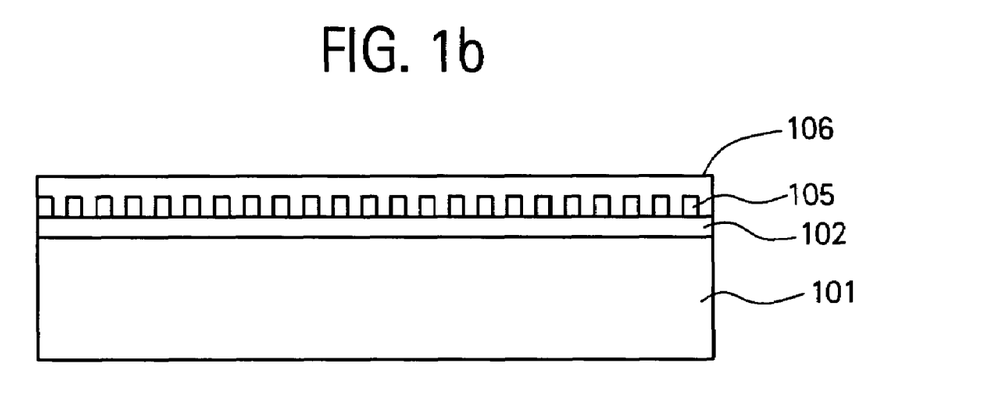
Figure 1C:
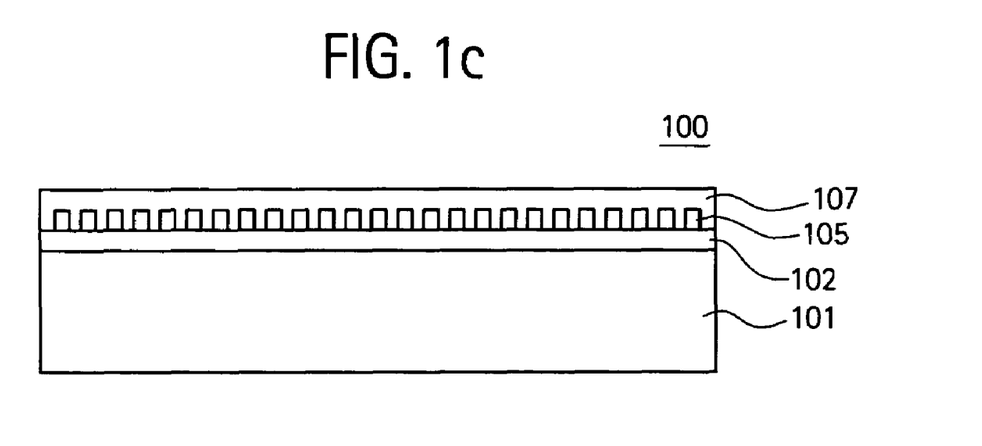

FIGS. 1a-1c are cross-sectional views of an illustrative fabrication sequence used to form a structure 100 in accordance with an example embodiment. The structure 100 includes a substrate 101, which may be a glass material suitable for the applications referenced previously. Exemplary materials include, but are not limited to, Code 1737 and EAGLE2000™ glass (manufactured by and available from Corning Incorporated, Corning, N.Y., USA) as well as other glass materials including borosilicate and aluminosilicate glasses. In example embodiments, the substrate 101 may be used in a display device; or may be used as a substrate in a solar panel.

FIG. 1a shows an optional barrier layer 102 disposed over the substrate 101. The barrier layer 102 is used to block migration of contaminants from the substrate 101 to the semiconductor material and devices of the example embodiments. The barrier layer 102 may be one or more layers chosen from among silicon nitride, silicon dioxide, or other known barrier materials amenable to processing according to example embodiments. Illustratively, this layer is deposited by a known chemical vapor deposition (CVD) technique to a thickness of approximately 50 nm to approximately 500 nm.

Next, a layer 103 is disposed over the barrier layer 102. As will become clearer as the present description continues, the layer 103 is useful in the formation of nucleation sites used to fabricate monocrystalline or polycrystalline semiconductor layers over the substrate 101 in accordance with example embodiments.

Illustratively, the layer 103 is a silane layer. The layer 103 may be a self-assembled monolayer (SAM), which may be of the type and function described later in this document and also in the parent application to Couillard, et al. which is now U.S. Pat. No. 7,071,022.

In an example embodiment, the silane layer is relatively thin, having a thickness of approximately 2 nm to approximately 10 nm. It is noted that silane with a thickness of up to approximately three monolayers may also be used. The silane layer usefully includes one or more functional groups that form a complex with a nucleation species of example embodiments. Illustratively, silane materials with a functional group of ethyleneaminoacidic acid, alkene, alkyne, amine, pyridine, imidazole, nitrile, thiol, benzene or phenol may be used. Other organometallic materials with the similar functional groups, such as aluminum compounds, titanium compounds, and zirconium compounds, may also be used.

The functional group(s) of the layer 103 is selected so that a later-formed seeding layer readily bonds to the functionalized coating from a solution, preferably an aqueous solution. The silane layer has functional group(s) that introduce approximately one to approximately three layers of the atoms of the seeding layer. The functional group(s) is a reactive group that forms a bond(s) with the seeding layer, which may be a metal. In accordance with an example embodiment, the silane layer with the functional group may be a coating formed using N-(trimethoxysilylpropyl)ethylenediamine triacetic acid or γ-aminopropyltrimethoxyl silane. Finally, the complex, or coordination compound, is a chemical compound in which bonds form between a metal as an electron acceptor and organic compound(s) as electron donor(s). The organic compound in the complex is called a complexing agent or ligand. Illustratively, ethylenediamine tetraacetic acid (EDTA) may be used as the complexing agent.

Next, a seeding layer 104 is deposited over the layer 103. As shown in FIG. 1b, the seeding layer 104 is then patterned to form nucleation sites 105, which provide a desired periodicity. Illustratively, the seeding layer 104 is patterned by microcontact printing. In the present example embodiment, the periodicity of the nucleation sites is chosen to replicate the periodicity of the structure that is desirably formed over the glass substrate 101. For example, the periodicity of the sites 105 replicates that of the picture elements (pixels) of a display.

In another example embodiment shown in FIGS. 2a-2e, the layer 103 is patterned prior to the disposition of the seeding layer 104 to provide to form a periodic structure 108 with desired periodicity for later fabrication of crystalline materials. Illustratively, the layer 103 is patterned using microcontact printing, photolithography or other known printing techniques. In the present example embodiment, after layer 103 is patterned with the desired periodicity, the seeding layer 104 is formed over the layer 103.

Figure 2A:
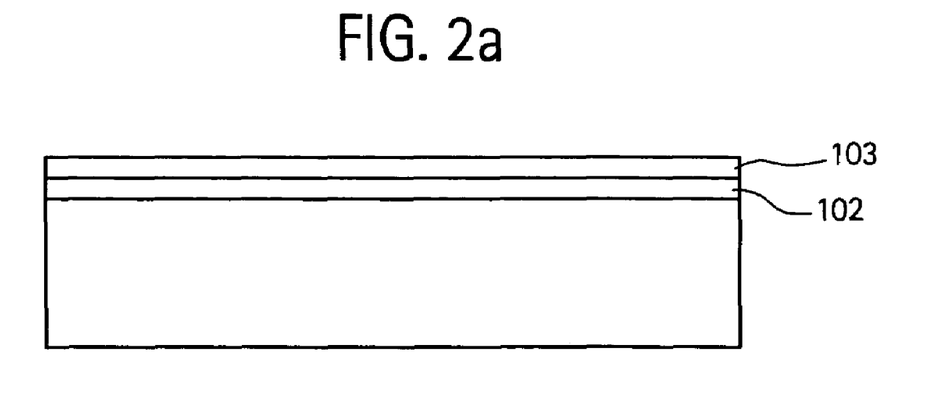
FIGS. 2a-2e are cross-sectional views of an illustrative fabrication sequence structure on a glass substrate in accordance with another exemplary embodiment.
Figure 2B:
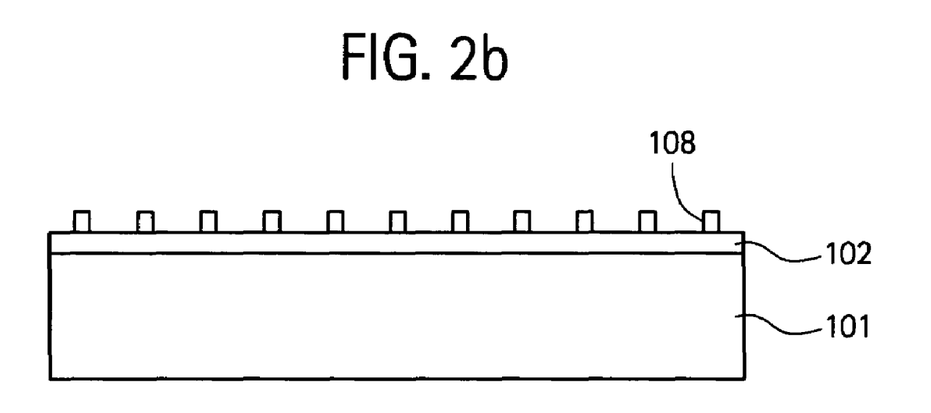
Figure 2C:
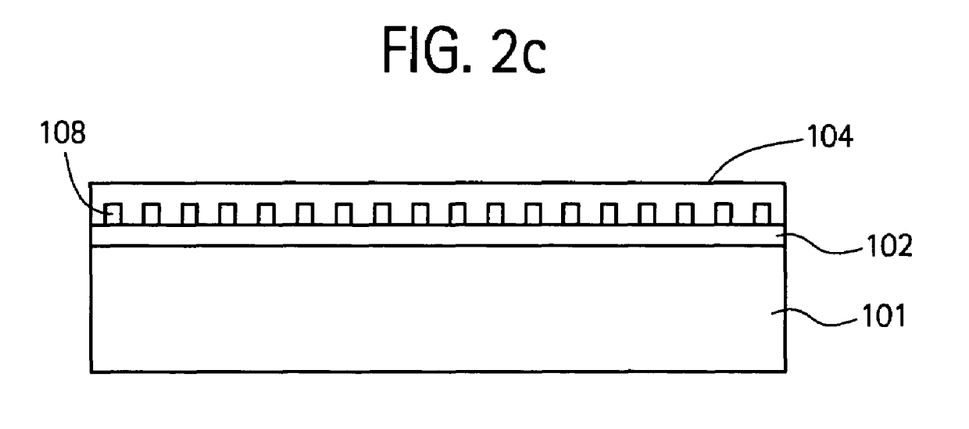
Figure 2D:
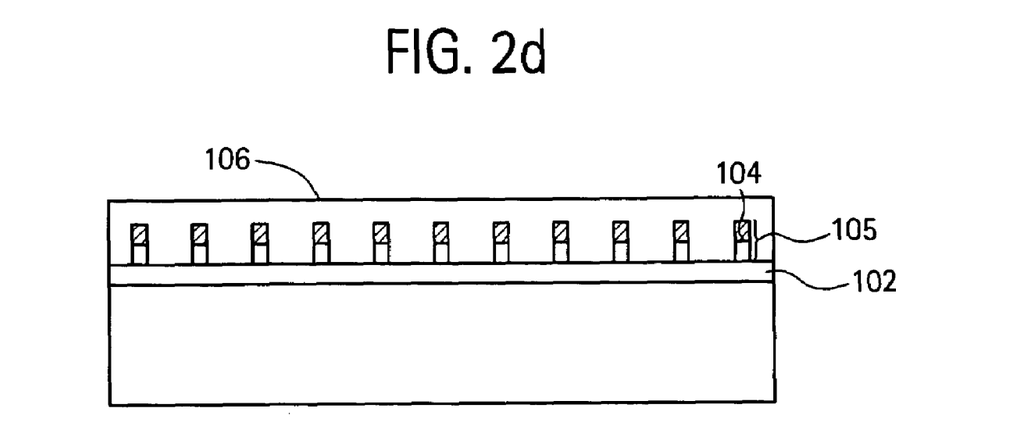
Figure 2E:
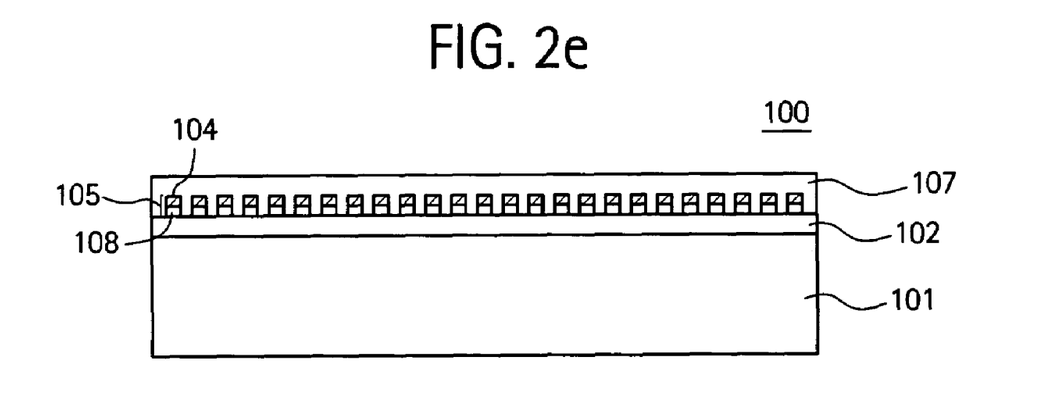

Regardless of whether the seeding layer 104 is patterned or the layer 103 is patterned per the illustrative embodiments described, the seeding layer 104 forms nucleation sites 105, which are shown in FIG. 1b and FIG. 2d. As explained more fully herein, the nucleation sites 105 are useful in forming crystalline materials at relatively low temperatures, and having material characteristics that are beneficial in a variety of applications.

In an example embodiment, the seeding layer 104 contains nickel. The nickel layer 104 can be deposited over the layer 103 by dip-coating of the layer 103 in a nickel solution, such as an aqueous solution containing a nickel salt of nitric acid, or acetic acid. Rinsing the substrate 101 using a solvent such as deionized (DI) water removes the extra nickel that is not bonded to the patterned layer 108. Thus, a patterned nickel layer, which comprises the nucleation sites 105, forms on the top of the SAM coating or the thin layer silane coating (layer 103), and has a periodicity that resembles that of the structure being formed.

The material of the seeding layer 104 is readily bonded to the functional groups of layer 103 from solution, resulting nucleation sites 105 of a few monolayers in thickness. It is noted that nickel with different oxidation states (0, +1 or +2) may be used for the nucleation sites 105 in example embodiments. The most common oxidation state of nickel is +2, or Ni (II). Reduction of Ni (II) to Ni (0) may not be necessary. If desired, Ni (II) can be reduced to Ni (0) in situ during the deposition of amorphous silicon because silicon is generally deposited in a reducing atmosphere. Ni (II) can also be reduced to Ni (0) ex situ before the deposition of amorphous silicon. For example, the substrate 101 with a Ni(II) based seeding layer 104 can be heated in 6% hydrogen in a nitrogen forming gas for 10 minutes at 300° C. to form Ni(0).

In example embodiments where silane is used as the layer 103, it is noted that silane with a functional group(s) that forms organometallic complexes with Ni (II) may be used to form the nucleation sites according to an example embodiment. To this end, Ni forms complexes with materials that are good electron donors. As such the functional groups may include nitrogen containing groups such as amines, nitro compounds, pyridines, imidazoles, nitrites. However, other functional groups can also form complexes with nickel such as carboxylates, thiols, ethylenediamines, alkenes, alkynes, alcohols, ethers, thioethers, esters, ketones, aldehydes, and aromatic compounds.

It is emphasized that nickel is merely an illustrative material for nucleation. Other metal or non-metal layers that function as a nucleation site for silicon crystallization may be used. Other illustrative materials for nucleation sites include, but are not limited to, platinum, palladium, and crystalline silicon nanoparticles, such as cobalt, iron, molybdenum, palladium, chromium, and aluminum.

In an example embodiment where the patterning layer 103 is a SAM layer, the functional group may also be created by modifying initial functional group(s) (e.g., a vinyl group) on the SAM coating using a chemical or physical process. Illustratively, a vinyl-terminated SAM coating can be converted to a carboxyl-terminated SAM coating. UV-ozone or oxygen plasma exposure of a methyl-terminated SAM can result in an oxygen containing surface that forms complexes with nickel.

It is noted that many silane materials with nickel complex-forming functional groups are hydrophilic. It is beneficial to pattern the substrate 101 with a hydrophobic silane material first and, then convert the silane material to a functional group with a better affinity with nickel. First, patterning a glass substrate with a hydrophobic silane material is easier than patterning the glass substrate 101 with a hydrophilic silane material because hydrophilic silane materials tend to diffuse on the substrate during the patterning process and result in less precise patterns. Second, hydrophilic silane materials tend to react with the substrate at their hydrophilic groups and thus result in less available functional groups for the following nickel layer coating. Conversion of a hydrophilic silane permits the use of an initial layer which is comprised of more economical, stable, readily available, etc., materials than would otherwise be the case.

After forming the nucleation sites 105, a layer 106 of amorphous semiconductor is disposed about and/or over the nucleation sites 105 as shown in FIGS. 1b and 2d. Illustratively, the amorphous semiconductor layer 106 is formed by low-temperature deposition techniques well-known to one of ordinary skill in the semiconductor processing arts. As described more fully herein, the amorphous semiconductor layer 106 is processed to form a layer of polycrystalline semiconductor or monocrystalline semiconductor material layer 107, shown in FIGS. 1c and 2e.

In an example embodiment, with a patterning layer 104 that includes Ni, the amorphous semiconductor layer 106 is amorphous silicon and a polycrystalline semiconductor layer 107 of silicon is formed. Beneficially, the patterned Ni layer induces crystallization of amorphous silicon during thermal annealing at relatively low temperatures over a short annealing period by forming nucleation centers of $NiSi_2$, or $Ni_2Si$, or both. Illustratively, the required annealing temperature is less than approximately 600° C., or even less than approximately 550° C. At these temperatures, the time required to crystallize amorphous silicon films is reduced from over approximately 72 hours to approximately 8 hours or less by the presence of the nickel nucleation centers.

Characteristically, semiconductor layer 107 has a relatively large grain size, which is substantially uniform; and a relatively high and uniform mobility. It is noted that compared to known displays and solar panels greater electron mobility characteristic of monocrystalline or poly-crystalline semiconductors of the example embodiments beneficially provides finer signal lines and smaller size individual transistors at each individual subpixel, which in turn provides brighter display fields, or lower power consumption, or both.

Figure 3A:
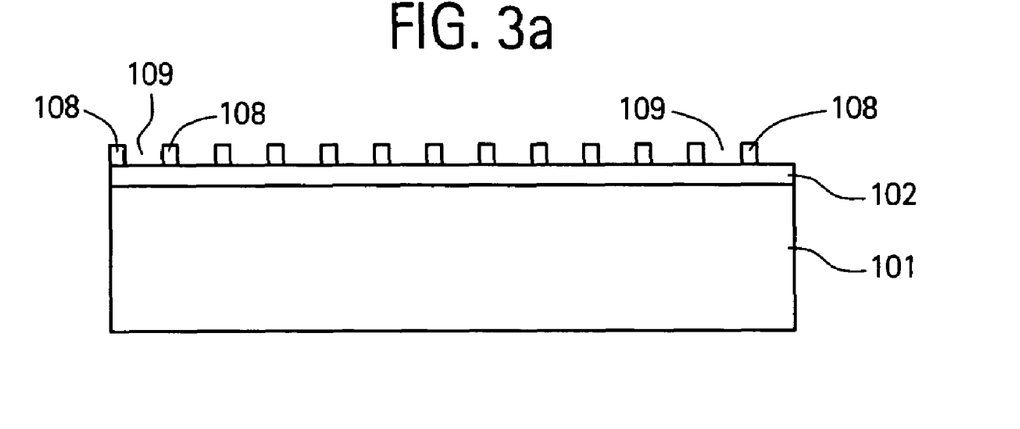
FIGS. 3a-3c are cross-sectional views of an illustrative fabrication sequence structure on a glass substrate in accordance with another exemplary embodiment.
Figure 3B:
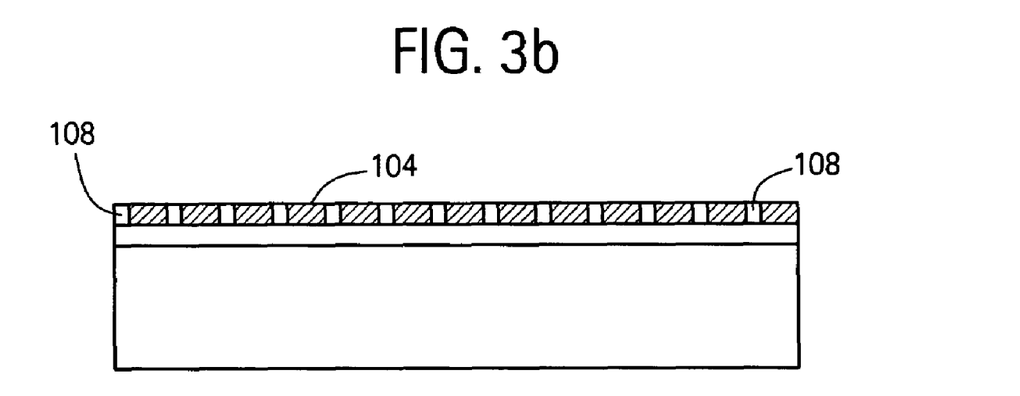

FIGS. 3a-3c show another example embodiment. In the present example embodiment, the layer 103 is a hydrophobic coating such as formed by silane with hydrocarbon or fluorocarbon chain(s). Additionally the hydrophobic silane materials may be octadecyltrichlorosilane or perfluorodecyltrichlorosilane. The hydrophobic layer 103 is patterned by microcontact printing techniques to form the periodic structure 108 having vacancies or openings 109. Next, as shown in FIG. 3b, the seeding layer 104 is disposed over the substrate 101. The seeding layer 104 of the present example embodiment is an aqueous (hydrophilic) solution.

As the seeding layer 104 is disposed over the layer 103 it is repulsed by the hydrophobic structures 108 and is disposed in the openings 109. Thus, a layer of discrete nucleation sites 105 is formed. The pattern of the layer 103 must provide openings 109 that replicate the desired periodicity needed for forming the desired structure of the substrate 101. To wit, the nucleation sites 105 must provide the periodic pattern for the desired structure. Thus, the seeding layer 104 of FIG. 3b is disposed in the openings 109 of the pattern of layer 103, and the resultant nucleation sites 105 are in the required periodic structure.

In accordance with an example embodiment, the periodic structure 108 is a hydrophobic coating such as a hydrocarbon silane or fluorocarbon silane layer. Illustratively, the substrate 101 is dipped in the hydrophilic (aqueous) nickel solution. Dipping the substrate 101 in a hydrophilic nickel solution will only coat areas where the hydrophobic silane coating is removed (i.e., the openings 109).

Figure 3C:
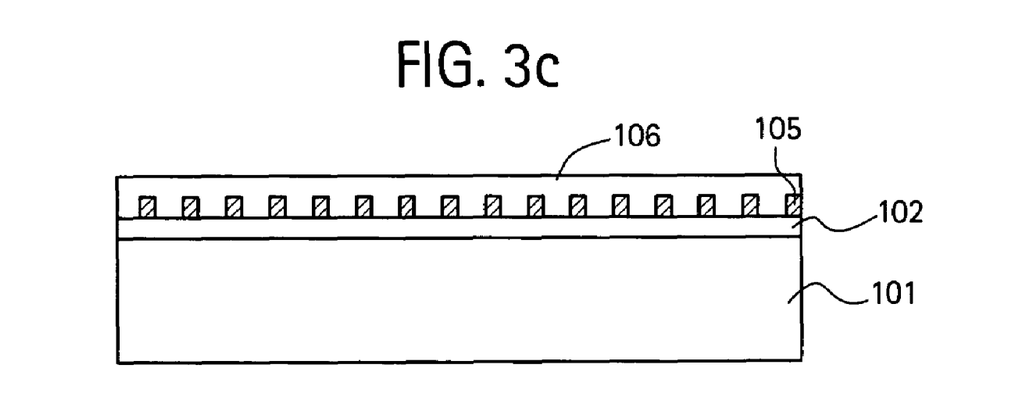

As shown in FIG. 3c, after forming the nucleation sites 105, the periodic structure 108 may be removed and a layer 106 of amorphous semiconductor is disposed about the nucleation sites 105. This layer 106 is processed to form a layer of polycrystalline semiconductor or monocrystalline semiconductor material layer using methods described in connection with the example embodiments previously described.

In the example embodiments, after the formation of the nucleation sites, the layer 103 and structure 108 are optionally removed. For example, if a silane or an organic SAM layer is used, the layer 103 can be removed by an anneal sequence at approximately 350° C. to approximately 550° C. in air. This leaves the nickel nucleation sites (e.g., sites 105) without the organic materials. However, it is noted that the remaining organic monolayer often does not interfere with the formed polycrystalline or monocrystalline layer formed. As such, these removal steps may be foregone.

It is noted that the nucleation sites 105 of the example embodiments described are controlled in number and size. For example, according to an example embodiment, the number of nickel atomic cluster centers is controlled. This limits the number of nuclei formed, and the size of polycrystalline semiconductor grains can be controlled. For example, in an example embodiment, the nickel cluster size and patterned is controlled by patterning the functional silane coating. This controls the crystal nucleus size and spacing between the nuclei. In keeping with an example embodiment, the nucleus size (diameter/width) is in the range of approximately 10 nm to approximately 50 μm and the spacing between nuclei in the range of approximately 1 μm to approximately 100 μm. Illustratively, the formation of nucleation sites having such sizes and spacing may be affected by patterning the silane by microcontact printing as referenced previously. Moreover, microcontact printing can produce features on the sub-micrometer scale, consistent with the desired size and spacing for nickel atomic cluster centers for large grain poly-Si growth.

Alternatively, photolithographic methods can also be used to produce the patterned silane surface. For example, octadecyltriethoxysilane can be coated on the glass substrate 101 with a barrier layer 102 to form a SAM coating. Then, a pattern can be formed by exposing the coated substrate in oxygen plasma or UW ozone using a photolithography mask that partially protects the SAM coating.

Beneficially, polycrystalline semiconductor materials formed by the example embodiments have a relatively high carrier mobility, greater than approximately 100 $cm^2/Vs$. Characteristically, this requires grain sizes that are greater than approximately 1.0 μm, and may be as large as 2.5 μm. Furthermore, the grain size over the polysilicon layer is uniform, varying less than approximately ±10% across the layer 107, and may vary less than approximately ±1% across the layer 107.

Beneficially, the relatively large grain size of the polycrystalline semiconductor material of the example embodiments provides a relatively high carrier mobility resulting in improved performance in the electronic devices formed therefrom. Furthermore, the uniformity of the grain size over the semiconductor fosters uniformity in the performance of like electronic components (e.g., TFTs) formed from the semiconductor layers. These and other benefits of the methods and apparati of example embodiments will be readily apparent to one of ordinary skill in the art having had the benefit of the present disclosure.

Figure 4A:
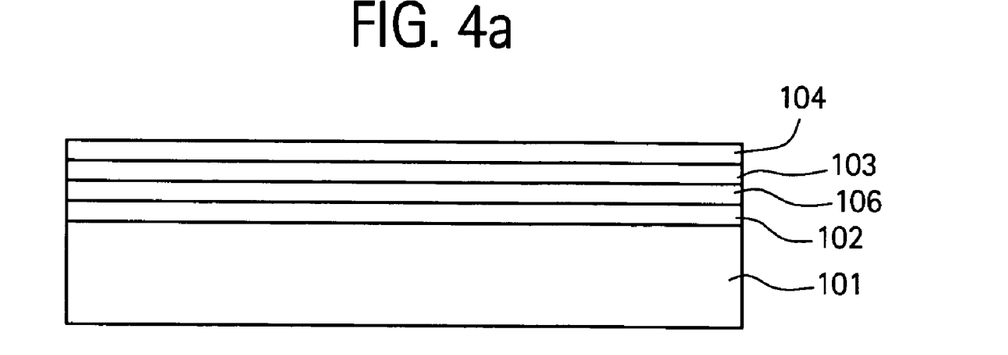
FIGS. 4a-4c are cross-sectional views of an illustrative fabrication sequence structure on a glass substrate in accordance with another exemplary embodiment.
Figure 4B:
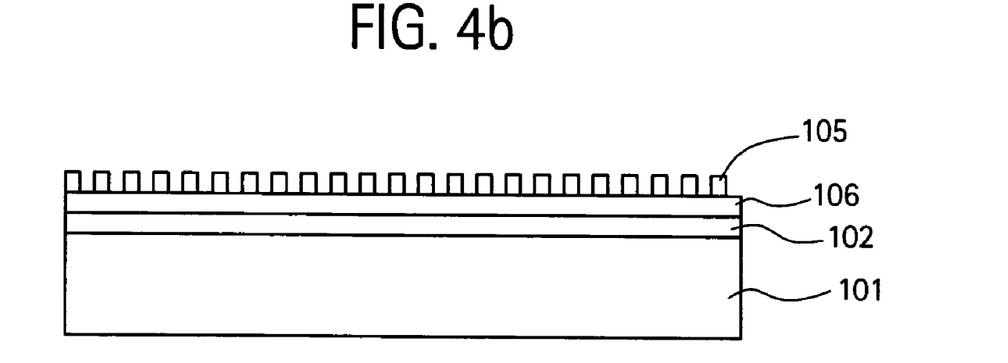
Figure 4C:
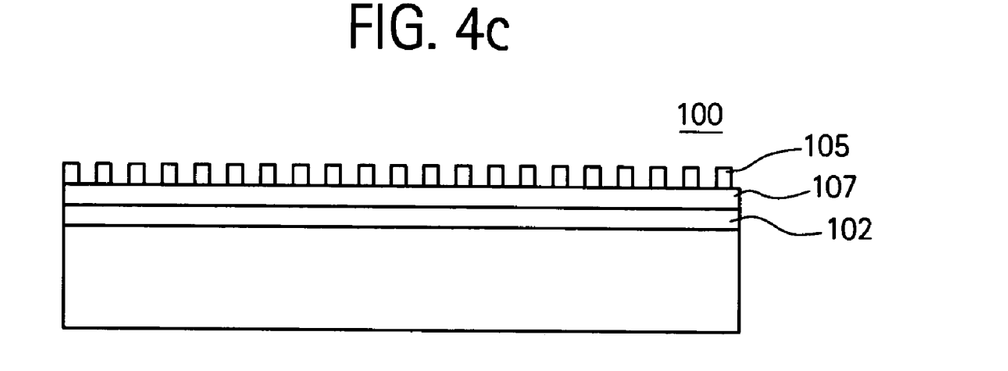

FIGS. 4a-4c show a fabrication method and resultant product in accordance with an example embodiment. As this embodiment shares many common features with the embodiments of FIGS. 1a-1c, 2a-2d and 3a-3c, common methods, materials and features will not be repeated so as to not obscure the description of the example embodiments.

In FIG. 4a, the barrier layer 102 is disposed over the substrate 101. Next, the amorphous semiconductor layer 106 is disposed over the barrier layer 102 and the layer 103 is disposed over the amorphous semiconductor layer. Finally, the seeding layer 104 is disposed over the layer 103.

As shown in FIG. 4b, a pattern of discrete nucleation sites 105 may be formed by methods described previously. Thereafter, an annealing step (such as described previously) is performed to crystallize the amorphous layer into the crystalline layer 107 to complete the structure 100 as shown in FIG. 4c.

As can be readily appreciated, the fabrication sequence of FIGS. 4a-4c provides the nucleation sites above the amorphous layer prior to the crystal growth sequence. It may be beneficial to fabricate the crystalline materials over the substrate according to the example embodiment of FIGS. 4a-4c in certain circumstances. Illustratively, if the nucleation sites 105 must be removed after forming the crystalline layer this illustrative sequence may facilitate this removal.

EXAMPLES

Specific examples are provided to illustrate the example embodiments described thus far.

Figure 5:
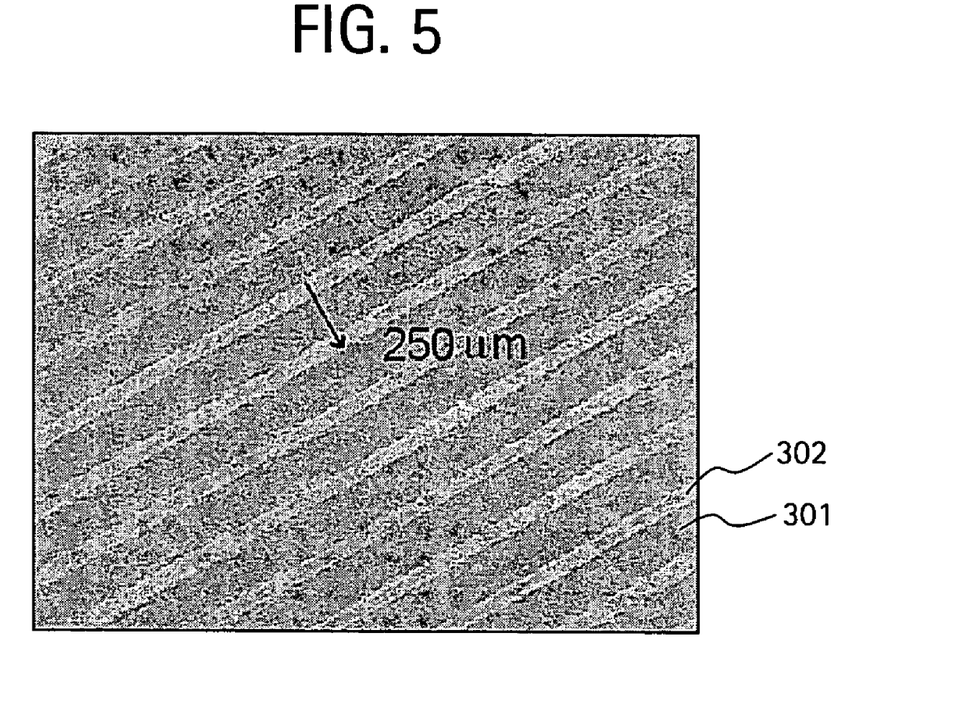
FIG. 5 is a microscopic top view of patterned self assembled monolayers on a surface of a substrate in accordance with an exemplary embodiment.

In a first example, a Corning Code 1737 glass substrate was patterned with octadecyltrichlorosilane (OTS) using microcontact printing. The substrate was then dipped in 0.0003 M nickel nitrate water solution.

FIG. 5 shows the pattern of nickel nitrate 301 on OTS patterned substrate. The nickel nitrate only covers the hydrophilic area, which is the area without OTS. The hydrophobic areas 302 between the nickel nitrate have a pitch of approximately 250 μm, with nickel nitrate-covered area being approximately 200 μm wide and the OTS covered area being approximately 50 μm wide. After burning off the organic part of silane and nitrate at 500° C. and reducing Ni(II) to Ni(0) at 400° C. in forming gas, 80 nm of amorphous Si was deposited by plasma enhanced chemical vapor deposition (PECVD).

Figure 6:
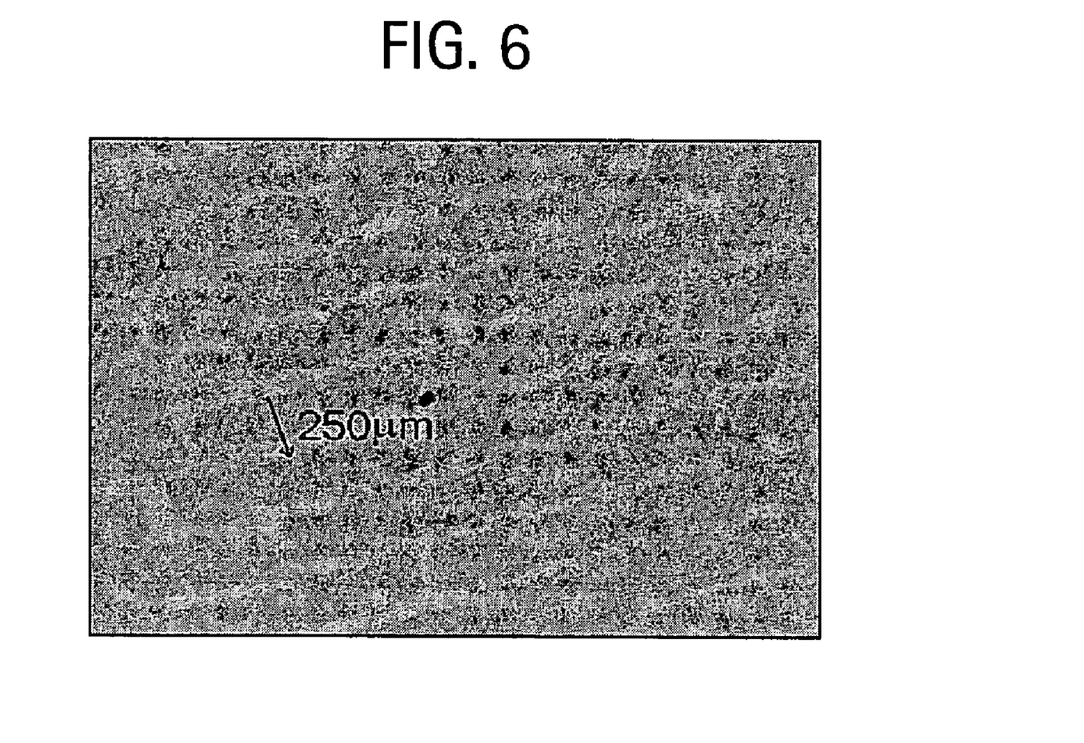
FIG. 6 is a microscopic top view of a partially crystallized silicon layer over a substrate in accordance with an example embodiment.

Next, as shown in FIG. 6, poly-Si is disposed over the nickel-patterned glass after annealing at 600° C. for 8 hours. This poly-Si has the beneficial traits described above. Note that in this example the silicon film is deliberately only partially crystallized, to illustrate the presence of amorphous and crystalline regions. The crystalline regions can be seen to mirror the original pattern of discrete nucleation sites.

In a second example, 2% γ-aminopropyltrimethoxyl silane is applied on a clean glass surface to form an amino-functional surface. The glass substrate with the amino-functional group is then dipped in 1% nickel (II) nitrate aqueous solution for 10 minutes. The excess nickel is then rinsed off to leave a nickel monolayer. The rinse also removes nickel from the bare glass area. Thus, a patterned nickel layer forms. The silane is burned off at 500° C. for 1 hour, and amorphous silicon is deposited at a thickness of 100 nm by PECVD. An anneal step at 600° C. for up to eight hours crystallizes the amorphous silicon, yielding poly-Si with the traits described above.

In a third example, the surface of the glass substrate is patterned with cyano-terminated silane by microcontact printing of 0.02 M 11-cyanoundecyltrimethoxysilane solution in cyclohexane. This sequence results in SAM coated spots approximately 2 μm in diameter, and with approximately 2 μm spacing. Next, the patterned substrate is dipped in 1% Ni (II) nitrate aqueous solution for 10 minutes and rinsed to remove excess nickel and form patterned islands of a nickel monolayer. The substrate is heated at 500° C. for one hour to remove the organic monolayer and 100 nm of amorphous silicon film is deposited by PECVD. An anneal step at 600° C. for up to eight hours forms poly-Si with the beneficial traits described above.

In a fourth example, the substrate with an amorphous silicon layer is microcontact printed with a nickel containing solution. A anneal step crystallizes the amorphous silicon at 600° C. for up to eight hours to obtain poly-Si.

In a fifth example, the substrate is patterned with nickel salt of N-(trimethoxysilylpropyl)ethylenediamine triacetic acid using microcontact printing. Next, amorphous silicon is deposited on the patterned substrate by PECVD. Up to eight hour annealing at 600° C. crystallize the amorphous silicon to polycrystalline silicon.

As mentioned above, the silane layer 103 may be a self-assembled monolayer (SAM) 103 which is an organic molecular material that bonds to the substrate 101 (or the optional barrier layer 102), and is deposited by dip coating, for example. The structure of the organic material of the SAM 103 is chosen for its resemblance to the crystalline spacing of the crystal (e.g., Si), which is desirably formed over the substrate 101 (glass substrate 101). To this end, the SAM 103 consists of close-packed, highly ordered arrays of long-chained hydrocarbon molecules, which form a hexagonal structure.

According to an exemplary embodiment, a characteristic of the SAM 103 required for fabricating crystalline material is the order and spacing of the molecules of the hydrocarbon chain, and particularly, of the exposed functional groups at the end of the SAM as discussed more fully below. The order and spacing of the SAM molecules are chosen to substantially match those of a silicon lattice, so that a silicon crystalline structure may be subsequently fabricated. As can be readily appreciated by one of ordinary skill in the art, according to the fabrication principles of the exemplary embodiments described herein, by selecting a SAM material with a suitable spacing, the fabrication of other crystalline structures (e.g., poly or mono crystalline Ge or SiGe) could also be affected on a substrate 101.

In accordance with an exemplary embodiment of the SAM layer 103 used for forming monocrystalline or polycrystalline silicon is illustratively comprised of a material of the composition $R-(CH_2)_N-Si-R'_2$. Examples of such a material may include undecenyltrichlorosilane ($C_{11}H_{21}Cl_3Si$) or docosenyltriethoyxsilane ($C_{28}H_{58}O_3Si$). It is noted that to form monocrystalline silicon, or other monocrystalline materials in referenced exemplary embodiments, long-range order of the particular SAM material is beneficial. This is achieved through chain lengths of N=8 to 20, with the highest degree of ordering around N=16.

The attachment of the SAM layer 103 to the surface of the substrate 101/protective layer 102 can be accomplished by several routes. When the substrate 101 is glass, silane chemistries may be used to that end. It is further noted that the R' groups can be cleaved to allow the Si atoms to attach to the oxygen of the glass. Alkoxy silanes or trihalo silanes are typically used, with the silane being hydrolized and condensed to form a siloxane polymer. The silanes would contain, or could be modified to contain, reactive functionality such that $SiH_4$ would react to form the base layer for silicon growth. Examples of suitable attachment groups include chlorosilane ($-SiCl_3$) methoxysilanes ($-Si(OCH_3)_3$), and ethoxysilanes ($-Si(OCH_2CH_3)_3$).

Another method of modifying the surface of a glass substrate 101 would utilize positively charged species such as guartenary amities, phosphoniums or sulfoniums. Positively charged groups are chosen since the surface silanols of the glass substrate are acidic (pH~3-5) and give the glass a bulk negative charge. These are also highly orientated systems that could contain the desired pendent functionality for reaction with the $SiH_4$ in any of the aforementioned reaction mechanisms.

In general, in order to form monocrystalline or polycrystalline silicon in accordance with exemplary embodiments it is useful for the SAM material to be comprised of silicon-terminated organic molecules, or of organic molecules terminated with a functional site such as an alkene that is favorable for silicon attachment.

According to an exemplary embodiment, during CVD deposition of silicon, the pendent functionality of the SAM 103 must interact and bond with species from the $SiH_4$ plasma typically used to deposit silicon. The nature of the interaction, or specifically the mechanism, is based on the reactions typically associated with the starting materials.

The $SiH_4$ plasma is by definition a high energy system whereby radicals are produced. These radicals are then the species that the design of the SAM system should take into account. A typical organic functional group that could involve radicals is the carbon double bond or alkene. Since the $SiH_4$ has both silicon and hydrogen, addition to the double bond can be completed without any secondary reagents. With the formation of the carbonsilyl hydride on the surface of the substrate, normal silicon growth can occur.

Another pendent functional group that addresses the radical nature of the plasma involves the use of spin labels or spin traps. These are organic groups typically used for Electron Spin Resonance (ESR) studies (such as the N-oxyl) that have an unpaired electron that is stable. These molecules can interact with other radicals to form fully spin paired species. As such, the spin traps can interact with the $SiH_4$ plasma forming an N-silyloxy hydride group that could then, as above, allow for normal silicon growth.

Another property of the $SiH_4$ group is that it is highly pyrophoric when exposed to air. This highlights the hydride nature of the hydrogens bound to the silicon. Since the hydrogens are hydridic, another reaction pathway could include SAMs with labile hydrogens that are Lewis bases. That is, organic groups such as alcohols, amines, thiols, to name a few, could react with the $SiH_4$ generating silyl ethers, amities and thiols, respectively. As before, with the silyl hydride bound to the surface, normal silicon growth can occur.

In an exemplary embodiment the cleaving of the R' groups of the SAM is carried out during deposition of the SAM material 103, allowing the Si atoms to bond to the oxygen of the glass substrate 101. A dilute solution of approximately 1 mM to approximately 10 mM of the SAM material is dissolved in an organic solvent such as hexane, cyclohexane, or toluene. After cleaning of the glass substrate 101 with solvents. UV exposure, and/or oxygen plasma, it is soaked in the SAM solution for up to one hour. The substrates are then removed, rinsed, and dried. The hydrocarbon chains are, therefore. $R-(CH_2)_N$. These hydrocarbon chains, alone with the silicon atoms are thus bonded to the glass substrate, and provide the highly ordered array.

Spacing between the molecules of the SAM layer 103 is controlled in part by the length of the hydrocarbon chains. The molecular spacing may be further modified by fluorinating all or part of the chain (i.e., converting $CH_2$ to $CF_2$), or by adding side hydrocarbon chains. In an exemplary embodiment the molecular spacing is substantially equal to the in-plane spacing of the semiconductor atoms in their hexagonal plane, or has an integral relationship (e.g. 2:1).

In view of this disclosure it is noted that the various methods and devices described herein can be implemented by a variety of methods and in a variety of technical areas where the need for monocrystalline and polycrystalline materials (e.g., semiconductors) on substrates. Among other limitations, these substrates may be of a material that cannot be heated above a certain temperature during semiconductor fabrication. Further, the various methods and parameters are included by way of example only and not in any limiting sense. Therefore, the embodiments described are illustrative and are useful in providing these beneficial semiconductor layers. In view of this disclosure, those skilled in the art can implement the various example devices and methods in determining their own techniques and needed equipment to effect these techniques, while remaining within the scope of the appended claims.

What is claimed is:

1. A layered structure, comprising:
   a substrate;
   a plurality of patterned nucleation sites disposed over portions of said substrate, wherein said patterned nucleation sites include a silane layer and a seeding layer, wherein said silane layer includes at least one self-assembled monolayer which has a composition R—(CH$_2$)$_N$—Si—R'$_3$ with a cleaved R' group; and a crystalline layer disposed over said patterned nucleation sites and exposed portions of said substrate, where said crystalline layer was formed from an amorphous semiconductor.

2. The layered structure as recited in claim 1, wherein the crystalline layer is either monocrystalline or polycrystalline.

3. The layered structure as recited in claim 1, wherein the crystalline layer is chosen from among silicon, silicon-germanium and germanium.

4. The layered structure as recited in claim 1, wherein the substrate is glass.

5. The layered structure as recited in claim 2, wherein the polycrystalline has grain sizes in the range of approximately 1.0 μm to approximately 2.5 μm.

6. The layered structure as recited in claim 2, wherein the polycrystalline has grain sizes which vary less than approximately ±10%.

7. The layered structure as recited in claim 2, wherein the polycrystalline has a carrier mobility that is greater than approximately 100 cm$^2$/V-s.

8. The layered structure as recited in claim 1, further comprising a baffler layer disposed between said substrate and both of said patterned nucleation sites and said crystalline layer.

9. The layered structure as recited in claim 1, wherein said seeding layer is a patterned seeding layer.

10. The layered structure as recited in claim 1, wherein said seeding layer is a nickel seeding layer.

11. The layered structure as recited in claim 1, wherein said silane layer is a patterned silane layer.

12. A layered structure, comprising:

a substrate;

a plurality of patterned nucleation sites disposed over portions of said substrate, wherein said patterned nucleation sites are formed from a silane layer and a seeding layer, wherein said silane layer is a hydrophobic coating when first applied to said substrate and said seeding layer is a hydrophilic solution; and a crystalline layer disposed over said patterned nucleation sites and exposed portions of said substrate, where said crystalline layer was formed from an amorphous semiconductor.

13. A layered structure, comprising:
a substrate;
a crystalline layer disposed over said substrate, where said crystalline layer was formed from an amorphous semiconductor; and a plurality of patterned nucleation sites disposed over portions of said crystalline layer, wherein said patterned nucleation sites include a silane layer and a seeding layer, wherein said silane layer includes at least one self assembled monolayer which has a composition R—(CH$_2$)$_N$—Si—R'$_3$; with a cleaved R' group, wherein:

said seeding layer was patterned after being deposited on said silane layer; or said silane layer was patterned prior to deposition of said seeding layer.

14. The layered structure as recited in claim 13, further comprising a baffler layer disposed between said substrate and both of said patterned nucleation sites and said crystalline layer.

15. A layered structure, comprising:

a substrate;

a plurality of patterned nucleation sites disposed over portions of said substrate, wherein said patterned nucleation sites include:

at least one self-assembled monolayer which has a composition R—(CH$_2$)$_N$—Si—R'$_3$ with a cleaved R' group; and a seeding layer; and a crystalline layer disposed over said patterned nucleation sites and exposed portions of said substrate, where said crystalline layer was formed from an amorphous semiconductor and said at least one self-assembled monolayer was removed after the formation of said crystalline layer.

16. A layered structure, comprising:

a substrate;

a crystalline layer disposed over said substrate, where said crystalline layer was formed from an amorphous semiconductor; and a plurality of patterned nucleation sites disposed over portions of said crystalline layer, wherein said patterned nucleation sites include:

at least one self-assembled monolayer which has a composition R—(CH$_2$)$_N$—Si—R'$_3$ with a cleaved R' group; and a seeding layer, wherein said at least one self-assembled monolayer was removed after the formation of said crystalline layer.

* * * * *

UNITED STATES PATENT AND TRADEMARK OFFICE
CERTIFICATE OF CORRECTION

PATENT NO. : 7,282,738 B2 Page 1 of 1
APPLICATION NO. : 10/851038
DATED : October 16, 2007
INVENTOR(S) : James Gregory Couillard et al.

It is certified that error appears in the above-identified patent and that said Letters Patent is hereby corrected as shown below:

| No. | Col. | Line | Description |
|---|---|---|---|
| 1 | 11 | 26 | "comprising a baffler layer disposed between said substrate" –should read– --comprising a barrier layer disposed between said substrate-- |
| 2 | 12 | 14 | "comprising a baffler layer disposed between said substrate" –should read– --comprising a barrier layer disposed between said substrate-- |

Signed and Sealed this

Seventeenth Day of June, 2008

JON W. DUDAS
*Director of the United States Patent and Trademark Office*